United States Patent [19]
Touba et al.

[11] Patent Number: 6,061,818
[45] Date of Patent: May 9, 2000

[54] ALTERING BIT SEQUENCES TO CONTAIN PREDETERMINED PATTERNS

[75] Inventors: Nur A. Touba, Austin, Tex.; Edward J. McCluskey, Palo Alto, Calif.

[73] Assignee: The Board of Trustees of the Leland Stanford Junior University, Stanford, Calif.

[21] Appl. No.: 09/074,848

[22] Filed: May 8, 1998

Related U.S. Application Data

[60] Provisional application No. 60/045,969, May 8, 1997.

[51] Int. Cl.[7] .............................. G01R 31/28; G06F 11/00
[52] U.S. Cl. ............................................. 714/739; 364/717
[58] Field of Search ....................... 371/27.2, 22.4–22.6, 371/27.1, 27.4–27.5, 22.33, 22.32; 364/717

[56] References Cited

U.S. PATENT DOCUMENTS

| | | | |
|---|---|---|---|
| 4,503,537 | 3/1985 | McAnney | 371/25 |
| 4,961,159 | 10/1990 | McLeod et al. | 364/717 |
| 5,485,471 | 1/1996 | Bershteyn | 371/27 |
| 5,612,963 | 3/1997 | Koenemann et al. | 371/27 |
| 5,774,477 | 6/1998 | Ke | 371/22.32 |

*Primary Examiner*—Trinh L. Tu
*Assistant Examiner*—Samuel Lin
*Attorney, Agent, or Firm*—Lumen Intellectual Property Services

[57] ABSTRACT

A low-overhead scheme for built-in self-test of digital designs incorporating scan allows for complete (100%) fault coverage without modifying the function logic and without degrading system performance (beyond using scan). By altering a pseudo-random bit sequence with bit-fixing logic at an LFSR's serial output, deterministic test cubes that detect random pattern-resistant faults are generated. A procedure for synthesizing the bit-fixing logic allows for complete fault coverage with low hardware overhead. Also, the present approach permits the use of small LFSR's for generating the pseudo-random bit sequence. The faults that are not detected because of linear dependencies in the LFSR can be detected by generating more deterministic cubes at the expense of additional bit-fixing logic.

19 Claims, 3 Drawing Sheets

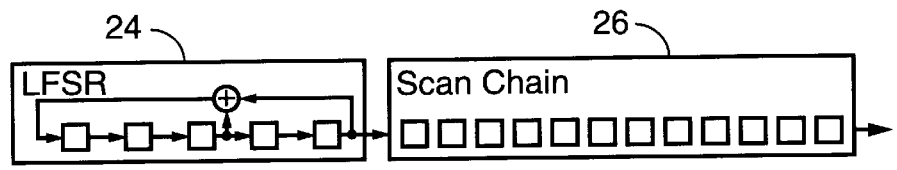
FIG. 5
FIG. 6
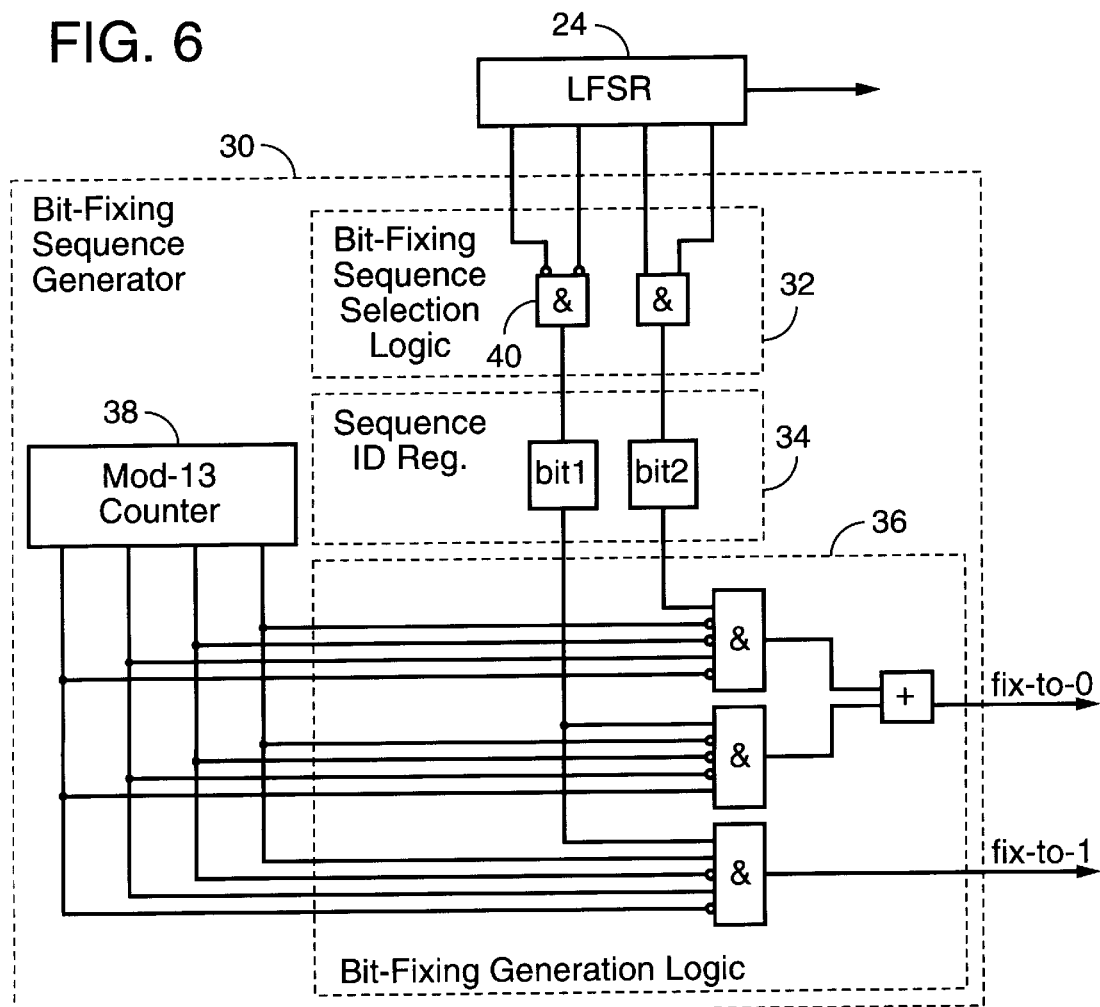

ALTERING BIT SEQUENCES TO CONTAIN PREDETERMINED PATTERNS

CROSS-REFERENCE TO RELATED APPLICATIONS

This application claims priority from U.S. Provisional Patent Application No. 60/045,969 filed May 8, 1997, which is incorporated herein by reference.

This invention was supported in part by the Ballistic Missile Defense Organization, Innovative Science and Technology (BMDO/IST) Directorate and administered through the Department of the Navy, Office of Naval Research under grant number N00014-92-J-1782, by the National Science Foundation under grant number MIP-9107760, and by the Advanced Research Projects Agency under prime contract number DABT63-94-C-0045. The Government has certain rights in the invention.

FIELD OF THE INVENTION

This invention relates generally to methods for altering bit sequences, such as pseudo-random bit sequences, to contain predetermined patterns. More specifically, one possible application relates to methods for altering bit sequences to improve fault detection in electronic circuits.

BACKGROUND OF THE INVENTION

External testing of digital systems involves the use of expensive testers. Built-in self-test (BIST) is a technique in which some tester functions are incorporated as part of the system so that the system can test itself. More specifically, special purpose hardware is used to generate test patterns that are applied to the circuit-under-test (CUT) and to analyze the output response. As the number of pins, speed, and complexity of integrated circuits continues to grow rapidly, BIST is becoming an increasingly important and attractive approach.

A conventional BIST approach is shown in FIG. 1. In this test-per-scan approach a linear feedback shift register (LFSR) 10 is used to generate a pseudo-random sequence of bit subsequences that are shifted directly into a scan chain 12. The bits in the scan chain 12 serve as test patterns applied to the circuit-under-test (CUT) 14. The response is loaded back into the scan chain 12 and shifted out into a signature register 16 for compaction. Meanwhile, new bits from the LFSR 10 are shifted into the scan chain 12 to serve as another test pattern. Each test pattern corresponds to a subsequence of the pseudo-random sequence generated by LFSR 10. Usually a large number of test patterns are required in order to adequately test a circuit.

Unfortunately, many circuits contain random-pattern-resistant (r.p.r.) faults which limit the fault coverage that can be achieved with this approach. Accordingly, several methods have been proposed for improving the fault coverage for a test-per-scan BIST scheme.

One solution is to modify the CUT 14 by either inserting test points or by redesigning it. These techniques generally add extra levels of logic to the circuit which may increase circuit delay and degrade system performance. Moreover, in some cases it is impossible or undesirable to modify the function logic (e.g., macrocells, cores, proprietary designs). In addition, if test points are inserted to increase the detection probabilities of the r.p.r. faults, the test points require that the function logic be modified.

Another solution is to add weighting logic to the BIST scheme in a way that biases the pseudo-random sequences towards those that detect the r.p.r. faults. This additional logic changes the probability that each bit in the pseudo-random sequence will be a 1 or a 0. The weight logic can be placed either at the input of the scan chain 12 or within the scan chain in the individual scan cells themselves. Multiple weight sets are usually required due to conflicting input values needed to detect r.p.r. faults. Because the weight sets need to be stored on-chip and control logic is required to switch between them, the hardware overhead can be large. An example of this approach is found in U.S. Pat. No. 5,612,963 to Koenenmann et al.

Another approach to improving the detection of r.p.r. faults is to use "mixed-mode" testing in which deterministic test patterns are used to detect the r.p.r. faults that the pseudo-random sequence misses. Storing deterministic patterns in a ROM, however, requires a large amount of hardware overhead. A variation on this technique that reduces the storage requirements is based on reseeding the LFSR 18 used for generating the pseudo-random sequence. A block diagram of a circuit implementing this type of approach is shown in FIG. 2. In this approach, precomputed seeds are loaded into the LFSR 18, which then generates deterministic sequences selected to improve r.p.r. fault detection. By storing a set of seeds in a ROM 20 instead of a set of deterministic patterns, the hardware overhead is reduced. Nevertheless, LFSR reseeding requires a ROM at least as large as the total number of specified bits in the set of test sequences that detect the r.p.r. faults. In addition, it requires a multi-phase test and additional reseeding control logic 22.

Other variations on the "mixed-mode" technique use a multiple-polynomial LFSR for encoding a set of deterministic test sequences. By "merging" and "concatenating" the sequences, they further reduce the number of bits that need to be stored. Even further reduction can be achieved by using variable-length seeds and a special automatic test pattern generation (ATPG) algorithm. This approach, however, still does not eliminate the need to store data in ROM. It also requires complex control logic for reseeding.

OBJECTS AND ADVANTAGES OF THE INVENTION

Accordingly, it is a primary object of the present invention to provide a simple, low-overhead technique for designing and implementing an efficient test pattern generator that provides high fault coverage for BIST applications. The generator should ensure that the test patterns contain certain deterministic test patterns that detect the r.p.r. faults of a given CUT. Moreover, the generator should permit an implementation of a single-phase test.

SUMMARY OF THE INVENTION

These objects and advantages are attained by a method for generating a sequence of test patterns by "fixing" certain predetermined bits in a generated bit sequence, such as in a pseudo-random sequence generated by an LFSR used in mixed-mode BIST. Predetermined test patterns are generated by altering subsequences of the bit sequence in accordance with dynamically generated bit-fixing ternary sequences corresponding to the subsequences. A bit-fixing ternary sequence is an ordered set of bit-fixing elements represented by 1's, 0's, and X's, which specify, respectively, whether the ternary sequence will fix-to-1, fix-to-0, or leave unchanged the bits in the corresponding subsequence. By applying the ternary sequences to the pseudo-random sequence an altered sequence is produced, which is then used as a sequence of test patterns. The ternary sequences are selected so that this sequence of test patterns is guaranteed to detect all faults of a specified CUT.

Decoding logic in a bit-fixing ternary sequence generator produces bit-fixing signals that are used to alter the bit sequence in accordance with a state of the sequence generator. In the BIST application, the decoding logic detects certain states of the LFSR and generates signals to fix the bits of the LFSR serial output to either a 1 or a 0, or to leave it unchanged. Alternatively, it may detect certain states of the control logic.

In contrast to weighted pattern testing which is probabilistic, the present deterministic method guarantees that certain test sequences will be applied to the CUT during a specified test length. Also, the present method does not require a multi-phase test in which control logic is needed to switch to different weight sets for each phase. The control circuitry is very simple because there is only one phase. The present method is also distinguished from weighted pattern testing in that the bit-fixing sequences of the invention are generated in dependence upon the state of the pseudo-random sequence generator, whereas in the weighted pattern testing scheme, the weights are generated independently of the particular state of the sequence generator.

The scheme presented here is also different from previous mixed-mode schemes for test-per-scan BIST, such as LFSR reseeding. Previous mixed-mode schemes for test-per-scan BIST have been based on storing compressed data in a ROM. In this scheme, no data is stored in a ROM; rather a logic circuit is used to dynamically fix bits in a way that exploits bit correlation among the test cubes for the r.p.r. faults. Small numbers of correlated bits are fixed in selected pseudo-random subsequences to make the altered subsequences match the test cubes. So rather than trying to compress the test cubes themselves, the present scheme compresses the bit differences between the test cubes and a selected set of pseudo-random subsequences. Since there are so many pseudo-random subsequences to choose from, a significant amount of compression can be achieved resulting in low overhead.

A hardware tradeoff that is made possible by the present approach is that a smaller LFSR can be used for generating the pseudo-random sequence. Normally, this may cause some faults to be undetected because of linear dependencies in the generated sequences, but with additional decoding logic the sequences can be altered to contain deterministic patterns for those faults.

The present approach can be used for either a "test-per-scan" or "test-per-clock" scheme and is capable of providing complete fault coverage with a reasonable test length. For circuits with scan, no function logic modification is required, and there is no system performance degradation.

Also disclosed is a synthesis procedure for altering the pseudo-random bit sequence to contain the deterministic test cubes in a way that minimizes hardware area. More specifically, the goal of the synthesis procedure is to minimize the amount of logic that is required to alter the pseudo-random sequence of bits generated by an LFSR while still preserving 100% fault detection.

DESCRIPTION OF THE FIGURES

FIG. 5 is a block diagram of a conventional LFSR and scan chain used to illustrate a method of designing a test pattern generator according to the present invention.

FIG. 6 is a block diagram detailing a simple bit-fixing ternary sequence generator according to the present invention.

DETAILED DESCRIPTION

Figure 1:
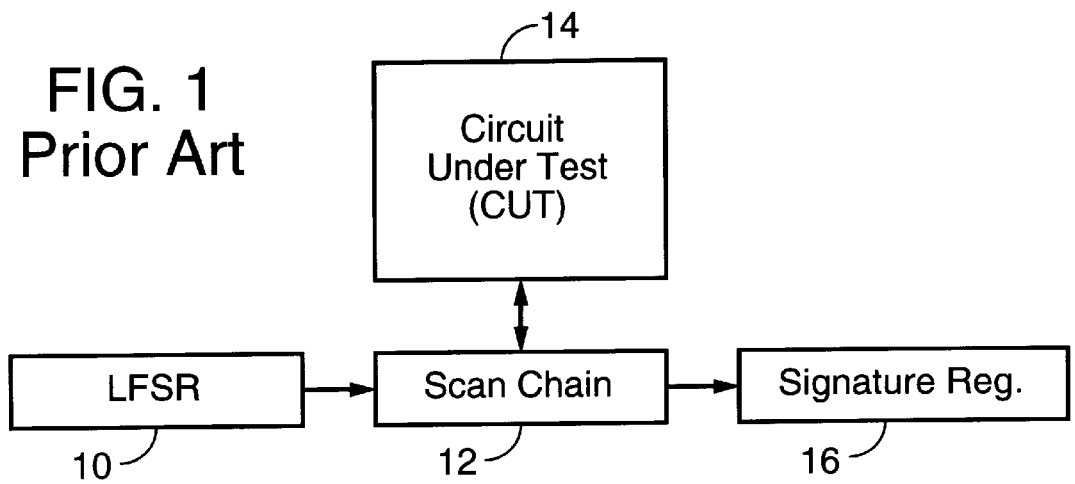
FIG. 1 is a block diagram of a conventional scan-based BIST scheme.
Figure 2:
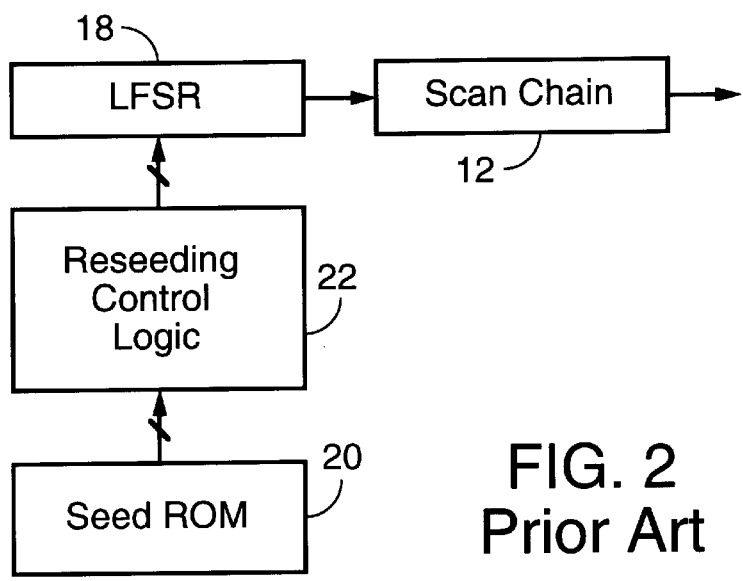
FIG. 2 is a block diagram of a conventional reseeding BIST scheme.
Figure 3:
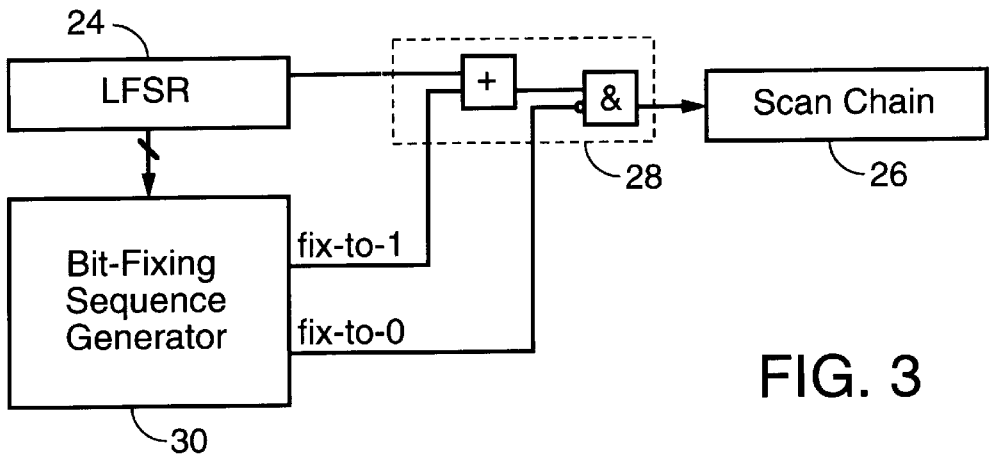
FIG. 3 is a block diagram of a bit-fixing BIST scheme according to the present invention.

The architecture of a bit-fixing BIST scheme according to the present invention is shown in FIG. 3. An LFSR 24, or other similar sequence generator, feeds a binary sequence into a scan chain 26 through a bit-altering logic circuit 28. Bit-altering circuit 28 alters predetermined bits of the sequence in accordance with fix-to-1 and fix-to-0 signals from a bit-fixing ternary sequence generator 30. If neither signal is active, the sequence passes unaltered into the scan chain. The purpose of the bit-fixing ternary sequence generator 30 is to generate bit-fixing signals used to alter the pseudo-random sequence of bits that is shifted into the scan chain 26. The pattern of alteration is selected in order to embed into the sequence deterministic test cubes that will ensure complete fault coverage. The specific alteration signals generated by bit-fixing ternary sequence generator 30 depend upon a state of the LFSR 24, as described in more detail below.

Figure 4:
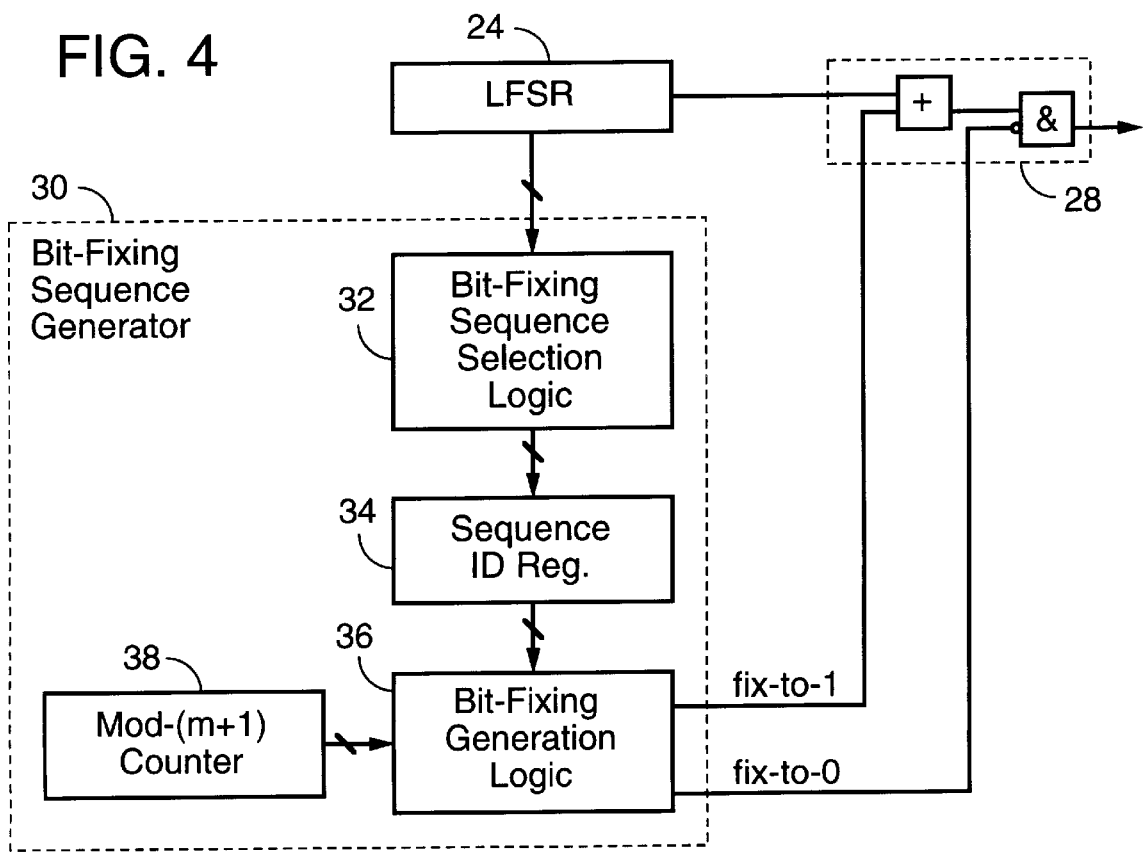
FIG. 4 is a block diagram of a test pattern generator according to the present invention.

FIG. 4 is a block diagram showing the components of bit-fixing ternary sequence generator 30. The ternary sequence generator 30 comprises bit-fixing ternary sequence selection logic 32 which decodes a state of LFSR 24, such as a subsequence starting state, and generates a ternary sequence identification (ID). The ternary sequence ID is stored in a ternary sequence ID register 34 and then passed on to bit-fixing generation logic 36. Bit-fixing generation logic 36 generates bit alteration signals based upon the ternary sequence ID and upon signals from a mod-(m+1) counter 38, where m is the length in bits of the scan chain. Note that the mod-(m+1) counter 38 is not additional overhead. It is needed in the control logic for any test-per-scan BIST technique to generate a control signal to clock the circuit-under-test when the scan chain is full. Thus, this scheme advantageously uses existing BIST control logic.

The mod-(m+1) counter 38 counts the number of bits that have been shifted out of LFSR 24 and into the scan chain. After m bits have shifted, the scan chain is full, so when the counter reaches the (m+1) state, the pattern of bits in the scan chain is applied to the CUT and the response is loaded back into the scan chain. At this point, the LFSR 24 contains the starting state for the next subsequence of bits that will be shifted into the scan chain. The bit-fixing ternary sequence selection logic 32 decodes the starting state in the LFSR 24 and selects a bit-fixing ternary sequence that will be used to alter the next sequence of bits. The selected bit-fixing ternary sequence ID is loaded into the ternary sequence ID register 34. As the counter 38 counts through the next m bits that are shifted out of the LFSR 24, the bit-fixing generation logic 36 generates the fix-to-1 and fix-to-0 control signals based on the value of the counter 38 and the bit-fixing ternary sequence ID stored in the ternary sequence ID register 34. Note that if both bit-fixing control signals are low, the original bit generated by LFSR 24 passes unaltered through bit-altering circuit 28 and into the scan chain. Thus, if the bit-fixing ternary sequence element is an X, then both bit-fixing signals are set to 0.

For each subsequence that is shifted out of the LFSR 24, the bit-fixing ternary sequence generator 30 is capable of generating one of $2^n$ different bit-fixing ternary sequences where n is the size of the ternary sequence ID register 34. A deterministic test pattern for an r.p.r. fault can be shifted into the scan chain by generating an appropriate bit-fixing ternary sequence for a given subsequence generated by the LFSR 24. The bit-fixing ternary sequence fixes certain bits in the subsequence such that the resulting pattern that is shifted into the scan chain detects the r.p.r. fault. As will be described in more detail below, the bit-fixing ternary sequence generator 30 is designed so that it generates enough deterministic test patterns to satisfy the fault coverage requirement for the CUT. Bit correlations (i.e. compatible values in particular bit positions) among the test patterns for the r.p.r. faults are used to minimize both the number of different bit-fixing ternary sequences that are required and the amount of decoding logic.

One characteristic of the test cubes for r.p.r. faults is that subsets of them often have the same specified bits (i.e. 1's or 0's) in particular bit positions (this will be referred to as "bit correlation"). For example, the 1st, 2nd, and 3rd bit elements of the test cubes 11011, 11X00, and 1X0X0 are correlated, while the 4th and 5th elements are not. That is, all of the specified bits in the 1st and 2nd bit positions are 1's, and all of the specified bits in the 3rd bit position are 0's. However, the 4th and 5th bit positions have conflicts because some of the specified bits are 1's and some are 0''s. Note that the unspecified elements (i.e. the X's) do not matter.

The reason why a significant amount of bit correlation often exists among the test cubes for the r.p.r. faults is probably due to the fact that several r.p.r. faults may be caused by a single random pattern resistant structure in the circuit. For example, if there is a large fan-in AND gate in a circuit, then that may cause all of the input stuck-at 1 faults and the output stuck-at 0 fault of the gate to be r.p.r. Accordingly, many of the specified bits in particular bit positions of the test cubes for these r.p.r. faults will be the same. Thus, there will be a significant amount of bit correlation among the test cubes. This phenomenon is seen in weighted pattern testing where probabilistic biasing of certain bit positions results in detecting a significant number of r.p.r. faults. According to the teaching of the present invention, bit correlation among the test cubes for the r.p.r. faults is advantageously used to minimize both the number of different bit-fixing ternary sequences that are required and the amount of decoding logic needed.

A procedure for designing a test pattern generator in accordance with the present invention is now described. For a given LFSR and CUT, a bit-fixing ternary sequence generator 30 which satisfies test length and fault coverage requirements can be designed using an automated procedure. According to this procedure, the bit-fixing ternary sequence generator 30 is designed to produce bit-fixing signals that alter the pseudo-random bit sequence generated by the LFSR to achieve the desired fault coverage for the given test length (number of scan sequences applied to the circuit-under-test).

The first step in the design procedure is to simulate the r-stage LFSR for the given test length L to determine the set of pseudo-random subsequences that would normally be applied to the circuit-under-test. For each of the L subsequences that are generated, the starting r-bit state of the LFSR is recorded (i.e., the contents of the LFSR right before shifting the first bit of the subsequence into the scan chain). Fault simulation is then performed on the CUT for the bit subsequences to see which faults are detected and which are not. The bit subsequence that drops each fault from the fault list (i.e., detects the fault for the first time) is recorded. The faults that are not detected are the faults that require altering of the subsequence. The pseudo-random sequence must be altered to generate test patterns that detect the undetected faults. An automatic test pattern generation (ATPG) tool is used to obtain test cubes for the undetected faults by leaving unspecified inputs as X's.

A simple contrived design example will be used to illustrate the procedure. A test pattern generator will be designed to provide 100% fault coverage for a sequence of 12 test subsequences (L=12) generated by a 5-stage LFSR (r=5) and shifted into a 12-bit scan chain (m=12), as shown in FIG. 5. The 12 bit subsequences that are generated by the LFSR and applied to the circuit-under-test through the scan chain are shown in Table 1.

TABLE 1

| Starting State | Subsequence Generated | Faults Dropped |
| --- | --- | --- |
| 01011 | 010000101011 | 7 |
| 11010 | 111110011010 | 5 |
| 11000 | 010111011000 | 2 |
| 00001 | 110100100001 | 0 |
| 11100 | 110001111100 | 1 |
| 01110 | 000010101110 | 0 |
| 01001 | 111001101001 | 0 |
| 00011 | 011101100011 | 0 |
| 00101 | 010010000101 | 0 |
| 10011 | 000111110011 | 1 |
| 11011 | 001010111011 | 0 |
| 00100 | 100110100100 | 0 |

For each subsequence, the starting state of the LFSR is shown and the number of faults that are dropped from the fault list is shown. Five of the subsequences drop faults while the other 7 do not. The pseudo-random subsequences detect 16 out of 20 possible faults giving a fault coverage of 80%. A conventional ATPG tool is used to obtain test cube patterns for the 4 undetected faults. These patterns are shown in Table 2.

TABLE 2

| Test Cube Patterns for Undetected Faults |
| --- |
| 111X00XXXX00 |
| 101X10XXXX0X |
| 000XX1XXXX00 |
| 01XX01XXXX10 |

The bit-fixing ternary sequence generator must be designed so that it alters the pseudo-random bit sequence in a way that all 4 test cubes are present in the scan chain.

Once the set of test cube patterns for the undetected faults has been obtained, the bit-fixing ternary sequence generator 30 is then designed to produce the bit-fixing ternary sequence signals corresponding to the test cube patterns. The bit-fixing signals are applied to the pseudo-random sequence in a way that guarantees that faults currently detected by the pseudo-random bit sequence will remain detected after the sequence is altered by the bit-fixing signals. This is done by only altering those bit subsequences that do not drop any faults. As long as the other subsequences that drop faults are not altered, the dropped faults are guaranteed to remain detected. This ensures that fault coverage will not be lost in the process of altering the original bit subsequences.

The goal in designing the bit-fixing ternary sequence generator 30 is to generate the required bit-fixing signals with a minimal amount of hardware. A hill-climbing strategy is used in which one bit position at a time is added to the ternary sequence ID register based on maximizing the number of test cubes that are generated each time. Bit positions continue to be added to the ternary sequence ID register until a sufficient number of test cubes can be generated to satisfy the fault coverage requirement. Complete fault coverage can be obtained by designing the circuit to generate test cubes for all of the undetected faults.

For each bit position that is added to the ternary sequence ID register during design, the first step is to determine for which subsequences the bit will be active (i.e. which subsequences will be altered). In order not to reduce the fault coverage, it is important to choose a set of subsequences that do not currently drop any faults in the CUT. In order to minimize the bit-fixing ternary sequence selection logic 32, it is also important to choose a set of bit subsequences that are easy to decode. The set of bit subsequences for which the new ternary sequence ID register bit will be active are decoded from the starting state of the LFSR for each sequence. Let F be a Boolean function equal to the sum of the minterms corresponding to the starting state for each bit subsequence that drops faults. Then an implicant in F' corresponds to a set of subsequences that do not drop faults and can be decoded by an n-input AND gate, where n is the number of literals in the implicant. A conventional binate covering procedure can be used to choose the largest implicant in F'. The largest implicant requires the least logic to decode and corresponds to the largest set of pseudo-random bit subsequences that do not drop any faults and thus is most desirable. These are the bit subsequences that will activate the new ternary sequence ID register bit.

In the design example there are 5 starting LFSR states that correspond to the bit subsequences that drop faults. They are listed in Table 3. The function F is formed. and the largest implicant in the complement of F is found. The largest implicant is 00XXX. Accordingly, whenever the first two bits in a starting state of the LFSR are both '0', then the new ternary sequence ID register bit is activated. Thus, there are 4 bit subsequences for which the new ternary sequence ID register bit will he activated.

TABLE 3

| Starting States for Sequences that Drop Faults |
| --- |
| 01011 |
| 11010 |
| 11000 |
| 11100 |
| 10011 |

After the set of subsequences that activates the new ternary sequence ID register bit have been determined, the next step is to determine which bits in the subsequences will be fixed when the new ternary sequence ID register bit is activated. The goal is to fix the bits in a way that maximizes the number of test cubes. The strategy is to find some good candidate sets of bits to fix and then compute how many test cubes would be generated if each were used. The candidate that produces the largest number of test cubes is then selected.

The candidate sets of bits to fix are determined by looking at bit correlation among the test cubes. For example, if the two test cubes 1010X and 00X11 are to be embedded, then fixing the 2nd bit position to a 0, the 3rd bit position to a 1, and the 5th bit position to a 1 would help to produce both test cubes. But fixing the 1st bit to a 1 or fixing the 4th bit to a 0 would only help to produce the first test cube; it would prevent the second test cube from being generated. The reason for this difference is that the two test cubes have conflicting values in the 1st and 4th bit. So, given a set of test cubes to generate, the best bits to fix are the ones in which there are no conflicting values among the test cubes.

A general procedure for selecting the set of bits to fix is as follows.
1. Place all test cubes to be generated into an initial set of test cubes. That is, begin by considering all of the test cubes that need to be generated to ensure complete coverage. In the design example, all 4 test cubes in Table 2 are considered initially.
2. Identify candidate bit positions where there are no conflicting bits among the test cubes. That is, for each bit position, if one or more test cube has a 1 and one or more test cube has a 0 in that same bit position, then there is a conflict. If all of the test cubes have either a 1 or an X in a given bit position, then the bit can be fixed to a 1. Similarly, if all of the test cubes have either a 0 or an X in a given bit position, then the bit can be fixed to a 0. In the design example, when all 4 test cubes in Table 2 are considered, only the last bit position has no conflicting bit, since all 4 of the test cubes have either a '0' or an 'X' in the last bit position.
3. Compute the number of test cubes that would be generated by fixing the candidate bits. That is, for each subsequence that activates the new ternary sequence ID register bit, fix the candidate bits that were determined in step 2. Count the number of test cubes that are generated by altering the subsequences by the resulting bit-fixing ternary sequence. In the design example, when the last bit position is fixed to a 0 in the 4 subsequences, it generates the test cube 01XX01XXXX10, which is used to alter the pseudo-random subsequence 011101100011.
4. If the number of test cubes for this candidate set of bits is larger than that of the best candidate then mark this set as the best candidate. The goal of choosing the set of bits to fix is to generate as many test cubes as possible.
5. Remove the test cube that will eliminate the most conflicts. One test cube is removed from consideration in order to increase the number of bits that can be fixed. The test cube that is removed is chosen based on reducing the number of conflicting bits in the remaining set of test cubes. In the design example, if the third test cube is eliminated from consideration, the remaining 3 test cubes have two bit positions where there are no conflicts. The third bit can be fixed to a 1 in addition to fixing the last bit to a 0.
6. If the number of test cubes that are embedded by the best candidate is greater than the number of test cubes that remain, then select the best candidate. Otherwise loop back to step 2. The next candidate set of bits to fix will only help to generate the remaining set of test cubes, and therefore has limited potential. If it is not possible for the next candidate to embed more test cubes than the best candidate, then the best candidate is selected as the set of bits to fix.
7. Eliminate as many fixed bits as possible without reducing the number of generated test cubes. In order to minimize hardware area, it is desirable to fix as few bits as possible. It may be possible to generate the test cubes without fixing all of the bits in the selected set. An attempt is made to reduce the number of fixed bits by eliminating one bit at a time and checking to see if the same test cubes are generated.

The bit-fixing ternary sequence generator is designed so that when the new ternary sequence ID register bit is activated, the set of bits selected by the procedure above is fixed. The pseudo-random bit subsequences that are altered to contain each test cube are added to the set of subsequences that drop faults (one subsequence per generated test cube). This is done to ensure that those subsequences are not further altered such that they would no longer generate the required test subsequences. If the fault coverage is not sufficient after adding the new ternary sequence ID register bit, then another ternary sequence ID register bit is added to allow for the generation of more test cubes.

In the design example, when all 4 test cubes are considered, the only specified bit position where there are no conflicts is the last bit position which can be fixed to a 0. Fixing this bit generates one test cube. However, when one of the test cubes is eliminated from consideration then the remaining 3 test cubes have two bit positions where there are no conflicts. Fixing these two bits enables all 3 of the remaining test cubes to be embedded. Thus, this is the selected set of bits to fix when the new ternary sequence ID register bit is activated. There is still one test cube that has not been generated, however. Since complete fault coverage is required, another bit must be added to the ternary sequence ID register. The three pseudo-random subsequences which generate the three test cubes are added to the set of subsequences that drop faults, and the procedure for adding a new ternary sequence ID register bit is repeated.

When enough bits have been added to the ternary sequence ID register to provide sufficient fault coverage, the remaining task is to synthesize the bit-fixing ternary sequence generation logic 36. The bit-fixing ternary sequence generation logic generates the fix-to-1 and fix-to-0 control signals to fix the appropriate bits in the sequence depending on which ternary sequence ID register bits are active. For each ternary sequence ID register bit that is active, control signals are generated when certain states of the counter are decoded.

The process of constructing the bit-fixing ternary sequence generation logic is best explained by an example. The bit-fixing ternary sequence generation logic for the design example is shown in FIG. 6. The first bit in the ternary sequence ID register 34 is activated whenever the first two bits in the starting seed for a subsequence are both 0. This condition is decoded using bit-fixing ternary sequence selection logic 32. In particular, a two-input AND gate 40 in selection logic 32 ensures that the first bit of the ternary sequence ID register is 1 when the first two bits of the LFSR seed are 0. The ID register is loaded right before shifting a new subsequence into the scan chain. When the first bit in the ternary sequence ID register is active, it fixes the first bit shifted into the scan chain to a 0 and the tenth bit shifted into the scan chain to a 1. This is done by generating a fix-to-0 signal when the counter is in the "cnt-1" state and a fix-to-1 signal when the counter is in "cnt-10" state. The second bit in the ternary sequence ID register is activated whenever the third and fourth bits in the starting seed for a sequence are both 1. When the second bit in the ternary sequence ID register is activated, it fixes the second bit shifted into the scan chain to a 0. This is done by generating a fix-to-0 signal when the counter is in "cnt-2" state.

When constructing the bit-fixing ternary sequence generation logic 36, the states of the counter can be decoded by simply using n-input AND gates where n is equal to the number of bits in the counter. However, once the logic has been constructed, it should be minimized using, for example, a conventional multilevel logic optimization tool.

The "don't care" conditions due to the unused states of the counter can be used to minimize the logic, but more importantly, the logic can be factored. Because the number of inputs to the logic is small, factoring is very effective for significantly minimizing the bit-fixing ternary sequence generation logic.

Since the bit-fixing ternary sequence generation logic is synthesized from a two-level starting point, it can be made prime and irredundant using synthesis procedures known in the art. If the full "don't care" set is used (i.e., all input combinations that do not occur during BIST are "don't cares"), then the resulting logic will be 100% tested for single stuck-at faults by the patterns applied during BIST.

The procedure described above has been used to design bit-fixing ternary sequence generators for benchmark circuits that contain random-pattern-resistant faults. The primary inputs and flip-flops in each circuit were configured in a scan chain. The bit-fixing ternary sequence generators were designed to provide 100% fault coverage of all detectable single stuck-at faults for a test length of 10,000 patterns. The results are shown in Table 4.

The size of the scan chain is shown for each circuit, followed by the maximum number of specified bits in any test cube contained in the test set (as reported in Hellebrand et al., "Pattern Generation for a Deterministic BIST Scheme," Proc. of International Conference on Computer-Aided Design (ICCAD), pp. 88–94, 1995). If the characteristic polynomial of the LFSR is primitive (as is the case in these results) and the number of stages in the LFSR is greater than or equal to the number of specified bits in a test cube for a fault, then the LFSR is guaranteed to be capable of generating patterns that detect the fault. If the number of stages in the LFSR is less than the number or specified bits in a test cube for some fault, then it may not be possible for the LFSR to generate a pattern that detects the fault due to linear dependencies in the LFSR.

TABLE 4

| Circuit | | Reseeding | | Bit-Fixing Ternary sequences | | |
|---|---|---|---|---|---|---|
| Name | Scan Size | Max. No. Spec. Bits | LFSR size | ROM Size | LFSR size | ID Reg. Size | Literal Count |
| s420 | 34 | 20 | 20 | 250 | 20 | 1 | 27 |
|  |  |  |  |  | 14 | 3 | 70 |
|  |  |  |  |  | 10 | 4 | 70 |
| s641 | 54 | 22 | 22 | 183 | 22 | 2 | 63 |
|  |  |  |  |  | 14 | 4 | 87 |
|  |  |  |  |  | 9 | 6 | 109 |
| s838 | 66 | 36 | 36 | 1623 | 36 | 5 | 168 |
|  |  |  |  |  | 14 | 7 | 176 |
|  |  |  |  |  | 12 | 7 | 199 |
| s1196 | 32 | 17 | 17 | 267 | 17 | 4 | 67 |
|  |  |  |  |  | 14 | 4 | 71 |
|  |  |  |  |  | 12 | 8 | 102 |
| s5378 | 214 | 19 | 27 | 726 | 19 | 3 | 163 |
|  |  |  |  |  | 14 | 4 | 174 |
|  |  |  |  |  | 12 | 9 | 367 |
| C2670 | 233 | 48 | 60 | 3412 | 48 | 4 | 328 |
|  |  |  |  |  | 16 | 5 | 334 |
|  |  |  |  |  | 10 | 12 | 427 |
| C7552 | 207 | 100 | 100 | 5241 | 100 | 7 | 741 |
|  |  |  |  |  | 36 | 8 | 782 |
|  |  |  |  |  | 17 | 13 | 828 |

Results are shown for the test pattern generator required for different size LFSR's. For each different size LFSR, the number of bits in the ternary sequence ID register is shown along with the factored form literal count for the multilevel logic required to implement the test pattern generator. For each circuit, results are shown for an LFSR with as many stages as the maximum number of specified bits. These LFSR's are guaranteed to be capable of generating patterns to detect all of the faults. For the smaller LFSR's there are some faults that are not detected because of linear dependencies in the LFSR. Extra test cubes must be produced in order to detect those faults thereby resulting in an increase in the area of the test pattern generator. As can be seen, in some cases adding just a small amount of logic to the test pattern generator permits the use of a much smaller LFSR. Consider C2670; using a 16-stage LFSR instead of a 48-stage LFSR only requires an additional 6 literals. However, in some cases there is a large increase in the amount of logic required for using a smaller LFSR. Consider s5378; using a 12-stage LFSR instead of a 14-stage LFSR increases the amount of logic in the test pattern generator by more than a factor of two.

Results for the reseeding method presented by Hellebrand et al. are shown in Table 4 for comparison. The size of the LFSR and the number of bits stored in a ROM are shown. Note that the reseeding method requires that the LFSR have at least as many stages as the maximum number of specified bits in any test cube. It is difficult to directly compare the two methods because they are implemented differently (ROM versus multilevel logic) and require very different control logic. The reseeding method requires that the LFSR have programmable feedback logic and parallel load capability as well as additional control logic for loading the seeds from the ROM.

There are numerous new and important features that distinguish the mixed-mode scheme disclosed above from other mixed-mode schemes for test-per-scan BIST. One is that the present method deterministically alters a pseudo-random bit sequence to contain predetermined test cubes for detecting random-pattern-resistant faults. Since there are so many possible pseudo-random sequences, correlations between certain bit positions can be used to minimize the test pattern generator hardware Another feature is that a one-phase test may be used. Having only one phase simplifies the BIST control logic. A third feature is that smaller LFSR's can be used. There is a tradeoff between the size of the LFSR and the amount of bit-fixing logic, so the LFSR size can be chosen to minimize the overall area. These features, and others, make the scheme of the present invention an attractive option for BIST in circuits with scan. In addition, it should be emphasized that this method allows for a reduction in the size of the sequence generator.

One way to achieve an even greater overhead reduction is to combine the present bit-fixing technique with various reseeding techniques. For example, by reseeding the LFSR with just a few selected seeds to generate some of the least correlated test cubes that require a lot of bit-fixing to generate, it may be possible to significantly reduce the complexity of the test pattern generator.

Another way to reduce the overhead is to develop a special ATPG procedure that finds test cubes for each r.p.r. fault in a way that maximizes the bit correlation among the test cubes. This reduces the amount of bit-fixing that is required to generate the test cubes.

Note that while the experimental results presented in this paper were for single stuck-at faults, the approach of embedding deterministic test cubes in a pseudo-random sequence works for other fault models (e.g.. multiple stuck-at faults and bridging faults) as well.

Those skilled in the art will appreciate that the above embodiment may be altered in many ways without departing from the scope of the invention. For example, the LFSR may be replaced by another other circuit which generates pseudo-random bit sequences, such as a cellular automaton. Moreover, the bit sequences need not be pseudo-random, but may be any type of bit sequences whose bits fluctuate in value. In addition, the sequence generator may feed more than one scan line from different stages. Alternatively, multiple scan lines can be produced by multiple sequence generators. Also, the feedback algorithm in the LFSR or similar circuit can be changed instead of, or in addition to, reseeding.

Another possible variation of the invention is to use a ROM to generate a set of subsequences n times and have bit-fixing logic that alters each subsequence n different ways. For example, a ROM can contain q subsequences, and each subsequence can be loaded from the ROM and shifted into the scan chain n times. Each time a subsequence is shifted into the scan chain, some bit-fixing logic is used to alter the subsequence so that it detects r.p.r. faults. The alteration is controlled by a counter which keeps track of how many times a particular subsequence has been shifted into the scan chain. Bit correlation among the test cubes for the r.p.r. faults is exploited in this manner by repeatedly generating a subsequence that is very similar to some of the test cubes and performing a small amount of bit-fixing to make the subsequence match a different test cube each time it is generated.

These and other variations will be obvious to those skilled in the art. Accordingly, the scope of the invention should be determined not by the specific embodiments described in detail above, but by the following claims and their legal equivalents.

What is claimed is:

1. A method implemented in an electronic circuit, the method comprising:
    (a) generating a pseudorandom binary sequence of bit subsequences;
    (b) producing from the bit subsequences a set of ternary sequences, wherein the ternary sequences comprise bit elements deterministically produced from the bit subsequences;
    (c) deterministically altering the bit subsequences in accordance with the ternary sequences to produce altered bit sequences containing predetermined bit patterns; and
    (d) applying the altered bit sequences to a circuit under test, wherein the ternary sequences are selected such that the altered bit sequences detect faults in the circuit under test.

2. The method of claim 1 wherein the bit elements include 1 elements, 0 elements, and X ("don't care") elements.

3. The method of claim 1 wherein the ternary sequences depend further upon a predetermined circuit under test.

4. The method of claim 1 further comprising shifting the altered bit sequences into a scan path associated with a circuit under test.

5. The method of claim 1 wherein the ternary sequences are produced by decoding the bit subsequences using a combinational logic circuit.

6. The method of claim 1 wherein the altering of the bit subsequences comprises performing logical operations between bits in the subsequences and the bit elements in the ternary sequences.

7. The method of claim 1 further comprising repeating step (a) to generate different pseudorandom sequences.

8. The method of claim 1 wherein the generating of the bit subsequences is performed by one or more linear feedback shift registers.

9. The method of claim 1 wherein the generating of the bit subsequences is performed by a cellular automaton.

10. An electronic circuit comprising:
(a) means for generating a pseudorandom binary sequence of bit subsequences;
(b) means for producing ternary sequences in response to the means for generating the binary sequence, wherein the ternary sequences comprise bit elements deterministically produced from the bit subsequences;
(c) means for deterministically altering the bit subsequences in accordance with the ternary sequences, resulting in an altered bit sequence containing predetermined bit patterns; and
(d) means for applying the altered bit subsequences to a circuit under test, wherein the ternary sequences are produced to detect faults in the circuit under test by the applied altered sequence.

11. The circuit of claim 10 wherein the ternary sequences of bit elements include 1 elements, 0 elements, and X ("don't care") elements.

12. The circuit of claim 10 wherein the ternary sequences are selected to detect faults in a circuit under test.

13. The circuit of claim 10 wherein the means for producing ternary sequences of bit elements comprises a combinational logic circuit connected to the means for generating the binary sequence.

14. The circuit of claim 10 wherein the means for producing predetermined ternary sequences comprises:
  a ternary sequence selection logic circuit;
  a ternary sequence identification register circuit; and
  a ternary sequence generation logic circuit.

15. The circuit of claim 10 wherein the means for altering the bit subsequences comprises a logic gate adapted to perform logical operations between bits in the subsequences and bit elements in the ternary sequences.

16. The circuit of claim 10 wherein the means for generating the bit sequence comprises a ROM.

17. The circuit of claim 10 wherein the means for generating the bit sequence comprises one or more linear feedback shift registers.

18. The circuit of claim 10 wherein the means for generating the bit sequence comprises a cellular automaton.

19. The circuit of claim 10 further comprising a set of scan paths fed by different stages of the means for generating the bit sequence.

\* \* \* \* \*